United States Patent
Taguchi

(10) Patent No.: US 11,528,010 B2
(45) Date of Patent: Dec. 13, 2022

(54) MULTIPLEXER AND COMMUNICATION APPARATUS

(71) Applicant: Murata Manufacturing Co., Ltd., Nagaokakyo (JP)

(72) Inventor: Tomoko Taguchi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 345 days.

(21) Appl. No.: 16/739,172

(22) Filed: Jan. 10, 2020

(65) Prior Publication Data

US 2020/0252053 A1 Aug. 6, 2020

(30) Foreign Application Priority Data

Jan. 31, 2019 (JP) .............................. JP2019-015623

(51) Int. Cl.
*H03H 9/72* (2006.01)
*H04B 1/00* (2006.01)
(Continued)

(52) U.S. Cl.
CPC ............... *H03H 9/725* (2013.01); *H03F 3/68* (2013.01); *H03H 9/059* (2013.01);
(Continued)

(58) Field of Classification Search
CPC . H03F 3/195; H03F 3/245; H03F 3/68; H03F 3/72; H03F 2200/111; H03F 2200/165; H03F 2200/171; H03F 2200/451; H03F 2203/7209; H03H 2001/0021; H03H 2001/0078; H03H 3/02; H03H 7/09;
(Continued)

(56) References Cited

U.S. PATENT DOCUMENTS 7,629,863 B2 * 12/2009 Iwamoto ................ H03H 9/725
333/195
7,688,159 B2 * 3/2010 Omura .................. H03H 9/0576
336/200
(Continued)

FOREIGN PATENT DOCUMENTS

CN 101079611 A * 11/2007 ............. H03H 9/725
CN 100557970 C * 11/2009 ............. H03H 9/725
(Continued)

*Primary Examiner* — Eric Nowlin
(74) *Attorney, Agent, or Firm* — Keating & Bennett, LLP

(57) ABSTRACT

A multiplexer includes a transmission filter and a reception filter connected to a common terminal, a first inductor connected to the common terminal, and a multilayer substrate on which the transmission filter and the reception filter are mounted and which includes dielectric layers. The transmission filter includes a parallel-arm resonator connected to a path between the common terminal and a transmission terminal and a parallel-arm terminal, and a second inductor connected to the parallel-arm terminal and ground. The first inductor includes a first coil pattern on a first dielectric layer and a second coil pattern on a second dielectric layer. The second inductor includes a third coil pattern on the first dielectric layer and that is magnetically coupled to the first coil pattern. The inductance value of the second coil pattern is greater than that of the first coil pattern.

20 Claims, 8 Drawing Sheets

(51) Int. Cl.
   *H03H 9/64*      (2006.01)
   *H03F 3/68*      (2006.01)
   *H03H 9/05*      (2006.01)

(52) U.S. Cl.
   CPC ......... *H03H 9/6483* (2013.01); *H04B 1/0057* (2013.01); *H03F 2200/165* (2013.01); *H03F 2200/171* (2013.01); *H03F 2200/451* (2013.01)

(58) Field of Classification Search
   CPC ...... H03H 7/463; H03H 7/48; H03H 9/02818; H03H 9/0557; H03H 9/0566; H03H 9/0576; H03H 9/059; H03H 9/605; H03H 9/6483; H03H 9/6489; H03H 9/706; H03H 9/72; H03H 9/74; H03H 9/725; H04B 1/0057; H04B 1/44; H04B 1/48; H05K 1/0298; H05K 1/185
   See application file for complete search history.

(56) References Cited

U.S. PATENT DOCUMENTS

| | | | | |
|---|---|---|---|---|
| 8,237,531 | B2* | 8/2012 | Qiu | H01F 17/0006 336/200 |
| 9,143,208 | B2* | 9/2015 | Khlat | H04B 7/0404 |
| 9,172,441 | B2* | 10/2015 | Granger-Jones | H04B 7/0404 |
| 9,225,382 | B2* | 12/2015 | Khlat | H04B 1/44 |
| 9,431,992 | B2* | 8/2016 | Yehezkely | H01F 5/003 |
| 9,722,639 | B2* | 8/2017 | Khlat | H04B 1/0064 |
| 9,735,850 | B2* | 8/2017 | Khlat | H04B 7/0608 |
| 9,806,773 | B2* | 10/2017 | Khlat | H04B 7/0617 |
| 9,876,513 | B2* | 1/2018 | Yun | H03H 7/0115 |
| 10,319,716 | B2* | 6/2019 | Moen | H01L 29/7375 |
| 10,325,907 | B2* | 6/2019 | Moen | H01L 29/0649 |
| 10,432,237 | B2* | 10/2019 | Takeuchi | H04J 1/045 |
| 10,477,550 | B2* | 11/2019 | Balteanu | H04L 5/001 |
| 10,574,206 | B2* | 2/2020 | Eihama | H05K 1/185 |
| 10,615,754 | B2* | 4/2020 | Braun | H04B 1/0028 |
| 10,666,229 | B2* | 5/2020 | Takata | H03H 9/6483 |
| 10,812,047 | B2* | 10/2020 | Genji | H03H 9/605 |
| 10,979,088 | B2* | 4/2021 | Chang | H04L 5/001 |
| 2004/0119562 | A1* | 6/2004 | Sakano | H03H 9/0576 333/133 |
| 2007/0046395 | A1* | 3/2007 | Tsutsumi | H03H 9/706 333/133 |
| 2007/0268091 | A1* | 11/2007 | Iwamoto | H03H 9/725 333/133 |
| 2008/0061906 | A1* | 3/2008 | Omura | H03H 9/72 333/133 |
| 2009/0002095 | A1* | 1/2009 | Terada | H03H 9/725 333/133 |
| 2013/0137381 | A1* | 5/2013 | Vassiliou | H04B 17/13 455/84 |
| 2014/0087671 | A1* | 3/2014 | Mostov | H02M 3/04 455/78 |
| 2014/0266531 | A1* | 9/2014 | Leipold | H03H 7/09 336/170 |
| 2014/0306779 | A1* | 10/2014 | Yehezkely | H04B 1/581 333/119 |
| 2014/0342678 | A1* | 11/2014 | Khlat | H04L 5/001 455/78 |
| 2015/0042417 | A1* | 2/2015 | Onodera | H03H 9/725 333/195 |
| 2016/0119003 | A1* | 4/2016 | Granger-Jones | H04L 5/001 370/276 |
| 2016/0233895 | A1* | 8/2016 | Khlat | H04B 1/40 |
| 2016/0373176 | A1* | 12/2016 | Khlat | H04B 1/18 |
| 2017/0111089 | A1* | 4/2017 | Khlat | H04B 7/0617 |
| 2017/0155376 | A1* | 6/2017 | Yamaguchi | H03H 9/64 |
| 2017/0288707 | A1* | 10/2017 | Yun | H03H 3/00 |
| 2018/0026606 | A1* | 1/2018 | Takata | H03H 9/725 370/278 |
| 2018/0152945 | A1* | 5/2018 | Balteanu | H04L 5/001 |
| 2018/0302059 | A1* | 10/2018 | Eihama | H03H 7/38 |
| 2018/0323187 | A1* | 11/2018 | Moen | H01L 29/7375 |
| 2018/0374842 | A1* | 12/2018 | Moen | H01L 21/761 |
| 2019/0044548 | A1* | 2/2019 | Freisleben | H04B 1/0057 |
| 2019/0052234 | A1* | 2/2019 | Braun | H04B 1/0028 |
| 2019/0123715 | A1* | 4/2019 | Genji | H03H 9/542 |
| 2019/0123771 | A1* | 4/2019 | Takeuchi | H01L 23/66 |
| 2019/0131051 | A1* | 5/2019 | Mukai | H03H 9/0557 |
| 2019/0190548 | A1* | 6/2019 | Chang | H04L 5/001 |
| 2019/0363695 | A1* | 11/2019 | Taguchi | H03H 9/725 |
| 2020/0259481 | A1* | 8/2020 | Kimura | H03H 9/725 |

FOREIGN PATENT DOCUMENTS

| | | | | |
|---|---|---|---|---|
| CN | 101180795 | B * | 10/2010 | ........... H03H 9/0576 |
| CN | 107431478 | A * | 12/2017 | ........... H03H 9/6483 |
| CN | 107431478 | B * | 10/2020 | ........... H03H 9/6483 |
| DE | 112016001482 | T5 * | 12/2017 | ........... H03H 9/6483 |
| EP | 1895661 | A1 * | 3/2008 | ........... H03H 9/0576 |
| EP | 1895661 | B1 * | 3/2014 | ........... H03H 9/0576 |
| JP | W02006137248 | A1 | 5/2006 | |
| JP | 2007312145 | A * | 11/2007 | ........... H03H 9/725 |
| JP | 4177389 | B2 * | 11/2008 | ........... H03H 9/725 |
| JP | 2015-033080 | A | 2/2015 | |
| JP | WO2019044659 | A1 * | 9/2020 | |
| JP | 6830541 | B2 * | 2/2021 | ........... H03H 7/38 |
| KR | 20070112011 | A * | 11/2007 | |
| KR | 100954643 | B1 * | 4/2010 | |
| KR | 20170124575 | A * | 2/2016 | |
| WO | WO-2006137248 | A1 * | 12/2006 | ........... H03H 9/0576 |
| WO | WO-2016158094 | A1 * | 10/2016 | ........... H03H 9/6483 |
| WO | WO-2018003378 | A1 * | 1/2018 | ........... H01F 17/00 |
| WO | WO-2019044659 | A1 * | 3/2019 | ........... H03H 7/38 |

* cited by examiner

MULTIPLEXER AND COMMUNICATION APPARATUS

CROSS REFERENCE TO RELATED APPLICATIONS

This application claims the benefit of priority to Japanese Patent Application No. 2019-015623 filed on Jan. 31, 2019. The entire contents of this application are hereby incorporated herein by reference.

BACKGROUND OF THE INVENTION

1. Field of the Invention

The present invention relates to a multiplexer and a communication apparatus.

2. Description of the Related Art

Mobile phones in recent years are required to support multiple frequency bands (multiband) with one terminal. In order to meet this requirement, a multiplexer that demultiplexes and/or multiplexes radio-frequency signals in multiple frequency bands is arranged immediately below one antenna. The multiplexer has a configuration in which multiple filters using the respective frequency bands as pass bands are connected to a common terminal.

Japanese Unexamined Patent Application Publication No. 2015-33080 discloses a multiplexer (radio-frequency module) in which a transmission filter and a reception filter are commonly connected to an external connection terminal. In the radio-frequency module disclosed in Japanese Unexamined Patent Application Publication No. 2015-33080, a first inductor that is connected between a parallel-arm resonator of a ladder acoustic waver filter (transmission filter) and ground is inductively coupled (magnetic coupling) to a second inductor connected to the external connection terminal. Each of the first inductor and the second inductor includes multiple coil patterns formed on a multilayer substrate. In order to generate the magnetic coupling between the first inductor and the second inductor, the coil patterns of the first inductor are arranged close to the coil patterns of the second inductor. This enables attenuation characteristics of the transmission filter and isolation characteristics between the transmission filter and the reception filter to be improved.

However, when the coil patterns formed in the multilayer substrate are arranged close to each other to generate the magnetic coupling between the inductors, as in the radio-frequency module disclosed in Japanese Unexamined Patent Application Publication No. 2015-33080, the degree of magnetic coupling between the inductors is varied due to variations in, for example, the accuracy of dimension in manufacturing and physical property values of the multilayer substrate. The variation in the degree of magnetic coupling causes a problem in that the isolation characteristics between the filters are varied.

SUMMARY OF THE INVENTION

Preferred embodiments of the present invention provide multiplexers and communication apparatuses each having stable isolation characteristics because variations in a degree of magnetic coupling is reduced or prevented.

A multiplexer according to a preferred embodiment of the present invention includes a common terminal; a first terminal; a second terminal; a first filter that is located between the common terminal and the first terminal and that uses a first frequency band as a pass band; a second filter that is located between the common terminal and the second terminal and that uses a second frequency band different from the first frequency band as the pass band; a first inductor connected to the common terminal; and a multilayer substrate on which the first filter and the second filter are mounted and which includes a plurality of dielectric layers including conductor patterns provided thereon. The first filter includes a first parallel-arm resonator connected between a first path between the common terminal and the first terminal and a first parallel-arm terminal, and a second inductor connected between the first parallel-arm terminal and ground. One of the first inductor and the second inductor includes a first coil pattern provided on a first dielectric layer, among the plurality of dielectric layers, and a second coil pattern provided on a second dielectric layer of the plurality of dielectric layers different from the first dielectric layer. Another of the first inductor and the second inductor includes a third coil pattern that is provided on the first dielectric layer and that is magnetically coupled to the first coil pattern. The inductance value of the second coil pattern is higher than the inductance value of the first coil pattern.

According to preferred embodiments of the present invention, it is possible to provide multiplexers and communication apparatuses each having stable isolation characteristics because the variations in the degree of magnetic coupling is reduced or prevented.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
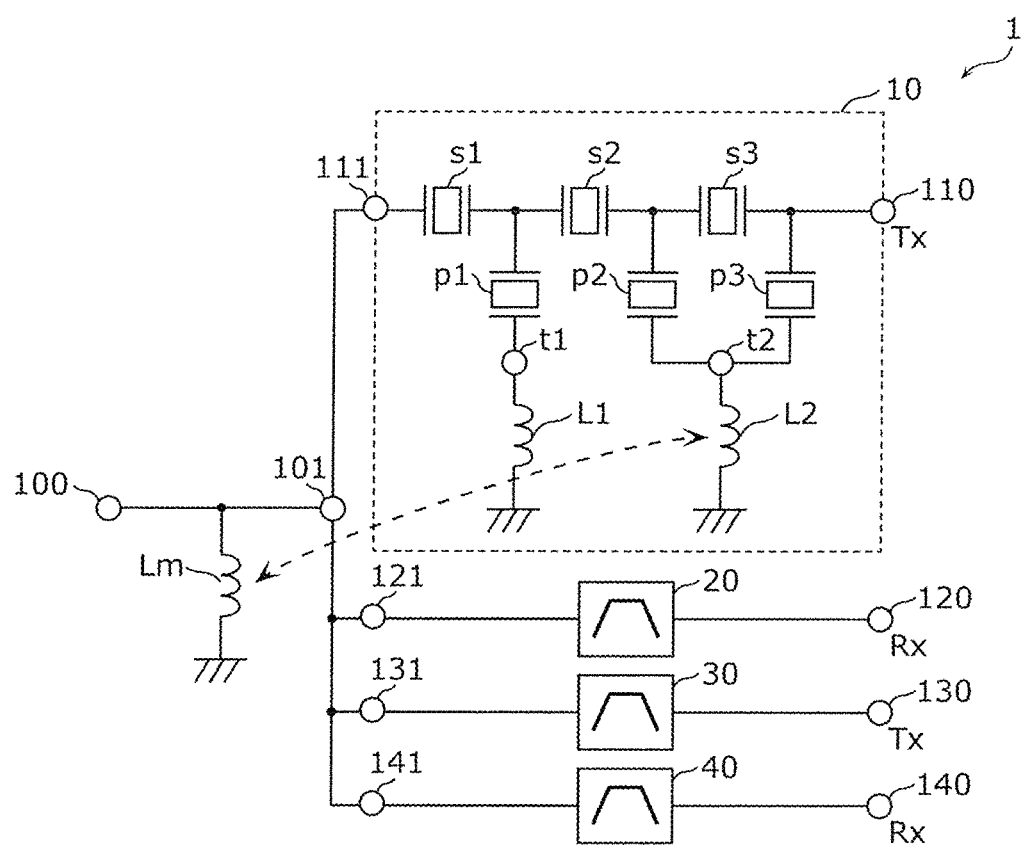
FIG. 1 is a circuit diagram of a multiplexer according to a first preferred embodiment of the present invention.

Preferred embodiments of the present invention will herein be described in detail with reference to the drawings. The preferred embodiments described below indicate comprehensive or specific examples. Numerical values, shapes, materials, components, the arrangement of the components, the connection configuration of the components, and so on, which are indicated in the preferred embodiments described below, are only examples and are not intended to limit the present invention. Among the components in the preferred embodiments described below, the components that are not described in the independent claims are described as optional components. In addition, the sizes or the ratios of the sizes of the components illustrated in the drawings are not necessarily strictly indicated.

First Preferred Embodiment

1. Circuit Configuration of Multiplexer

FIG. 1 is a circuit diagram of a multiplexer 1 according to a first preferred embodiment of the present invention. Referring to FIG. 1, the multiplexer 1 includes a common terminal 100, transmission terminals 110 and 130, reception terminals 120 and 140, transmission filters 10 and 30, reception filters 20 and 40, and an inductor Lm.

The transmission filter 10 is a first filter that is provided between the transmission terminal 110 (a first terminal) and an output terminal 111 and that uses, for example, a BandA transmission band (a first frequency band) as a pass band. The output terminal 111 is connected to the common terminal 100.

The transmission filter 10 includes series-arm resonators s1, s2, and s3, parallel-arm resonators p1, p2, and p3, and inductors L1 and L2.

The series-arm resonators s1 to s3 are provided on a first path between the common terminal 100 and the transmission terminal 110.

The parallel-arm resonator p1 is connected between the first path and a parallel-arm terminal t1. The parallel-arm resonator p2 is a first parallel-arm resonator connected between the first path and a parallel-arm terminal t2 (a first parallel-arm terminal). The parallel-arm resonator p3 is connected between the first path and the parallel-arm terminal t2 (the first parallel-arm terminal).

One end of the inductor L1 is connected to the parallel-arm terminal t1 and the other end thereof is connected to ground. The inductor L2 is a second inductor one end of which is connected to the parallel-arm terminal t2 and the other end of which is connected to the ground.

With the above configuration, the transmission filter 10 defines a ladder band pass filter including the series-arm resonators and the parallel-arm resonators. The frequency of an attenuation pole and the attenuation of the transmission filter 10 and the insertion loss and the ripple in the pass band are capable of being adjusted depending on the arrangement of the inductors L1 and L2.

The inductor L1 may not be provided in the transmission filter 10. In addition, the inductor L2 may not be connected to both of the parallel-arm resonators p2 and p3 and may be connected to one of the parallel-arm resonators p2 and p3. Alternatively, the inductor L2 may be commonly connected to the parallel-arm resonators p1, p2, and p3.

The transmission filter 10 may be any of a surface acoustic wave filter, an acoustic wave filter using bulk acoustic waves (BAW), an LC resonance filter, and a dielectric filter, for example. The acoustic waves include, for example, Love waves, leaky waves, Rayleigh waves, boundary waves, leaky surface acoustic waves (leaky SAW), pseudo surface acoustic waves (pseudo SAW), and plate waves.

It is sufficient for the transmission filter 10 to at least include the parallel-arm resonator p2 or p3 and the inductor L2, and the transmission filter 10 may not include the series-arm resonators s1 to s3, the parallel-arm resonator p1, and the inductor L1.

The reception filter 20 is provided between an input terminal 121 and the reception terminal 120 and uses, for example, a BandA reception band as the pass band. The input terminal 121 is connected to the common terminal 100.

The reception filter 20 is not limited to any of the surface acoustic wave filter, the acoustic wave filter using the BAW, the LC resonance filter, and the dielectric filter and may be an LC filter, for example. The reception filter 20 may have an arbitrary filter structure.

The transmission filter 10 and the reception filter 20 may define a duplexer that is capable of concurrently transmitting and receiving, for example, a BandA radio-frequency signal.

The transmission filter 30 is provided between the transmission terminal 130 and an output terminal 131 and uses, for example, a BandB transmission band as the pass band. The output terminal 131 is connected to the common terminal 100.

The transmission filter 30 is not limited to any of the surface acoustic wave filter, the acoustic wave filter using the BAW, the LC resonance filter, and the dielectric filter and may be an LC filter, for example. The transmission filter 30 may have an arbitrary filter structure.

The reception filter 40 is a second filter provided between an input terminal 141 and the reception terminal 140 (a second terminal) and uses a reception band of, for example, BandB different from BandA as the pass band. The BandB reception band is referred to as a second frequency band. The input terminal 141 is connected to the common terminal 100.

The reception filter 40 is not limited to any of the surface acoustic wave filter, the acoustic wave filter using the BAW, the LC resonance filter, and the dielectric filter and may be an LC filter, for example. The reception filter 40 may have an arbitrary filter structure.

The transmission filter 30 and the reception filter 40 may define a duplexer that is capable of concurrently transmitting and receiving, for example, a BandB radio-frequency signal.

The inductor Lm is a first inductor provided between the common terminal 100 and the ground and is an element that provides impedance matching between an external circuit connected to the common terminal 100 and the transmission filters 10 and 30 and the reception filters 20 and 40. The inductor Lm may be provided in series between the common terminal 100 and the output terminals 111 and 131 and the input terminals 121 and 141.

The inductor L2 in the transmission filter 10 is magnetically coupled to the inductor Lm. Accordingly, bandpass characteristics of the transmission filter 10 are achieved by combining transmission characteristics in which the radio-frequency signal is transmitted on a main path through the transmission terminal 110, the series-arm resonators s3, s2, and s1, the output terminal 111, and the common terminal 100 and transmission characteristics in which the radio-frequency signal is transmitted on a sub-path through the transmission terminal 110, the parallel-arm resonators p2 and p3, the inductor L2, the inductor Lm, and the common terminal 100. At this time, in the bandpass characteristics of the transmission filter 10, adjusting the degree of magnetic coupling on the sub-path enables the attenuation pole to be provided in a desired frequency band. Accordingly, attenuation characteristics of the transmission filter 10 are capable of being improved. In conjunction with the improvement of the attenuation characteristics, cross-isolation characteristics between the transmission filter 10 and the reception filter 40 or isolation characteristics between the transmission filter 10 and the reception filter 20 are improved.

In the multiplexer 1 according to the first preferred embodiment, the transmission filter 30 and either of the reception filters 20 and 40 are not necessary components.

With the above circuit configuration, the multiplexer 1 is capable of concurrently transmitting and receiving a BandA radio-frequency transmission signal and a BandA radio-frequency reception signal. In addition, the multiplexer 1 is capable of concurrently transmitting and receiving a BandB radio-frequency transmission signal and a BandB radio-frequency reception signal. Furthermore, the multiplexer 1 is capable of concurrently transmitting, concurrently receiving, and concurrently transmitting and receiving a BandA radio-frequency signal and a BandB radio-frequency signal (carrier aggregation (CA)).

2. Structure of Multiplexer 1

Figure 2:
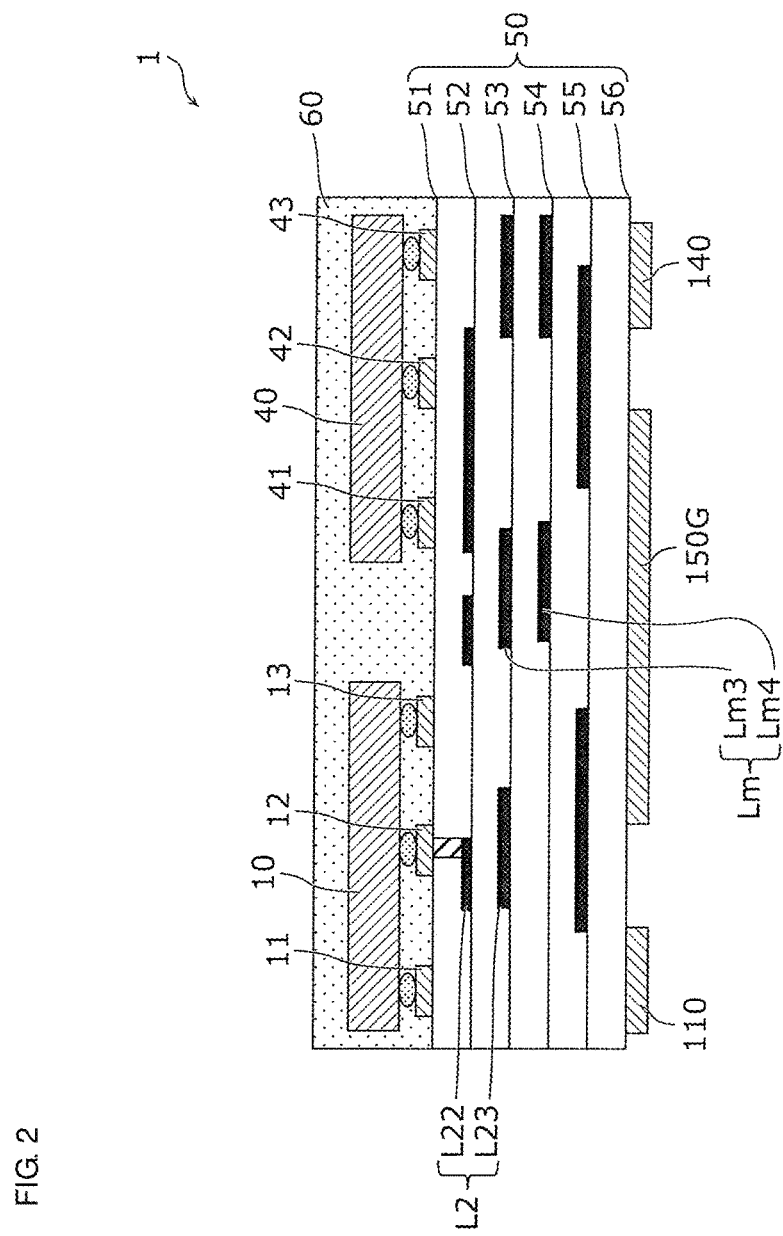
FIG. 2 is a diagram illustrating the cross section of the multiplexer according to the first preferred embodiment of the present invention.

FIG. 2 is a diagram illustrating the cross section of the multiplexer 1 according to the first preferred embodiment. Referring to FIG. 2, the multiplexer 1 further includes a multilayer substrate 50 and a resin member 60.

The multilayer substrate 50 includes a first main surface and a second main surface and is defined by a multilayer body including multiple dielectric layers 51 to 56 on which conductor patterns are provided. The transmission filter 10, the reception filter 20 (not illustrated), the transmission filter 30 (not illustrated), and the reception filter 40 are mounted on the first main surface of the multilayer substrate 50.

For example, a low temperature co-fired ceramic (LTCC) substrate or a printed circuit board is preferably used as the multilayer substrate 50.

The transmission filter 10 includes, for example, a surface acoustic wave resonator including a piezoelectric substrate and interdigital transducer (IDT) electrodes provided on the piezoelectric substrate. Connection electrodes that are provided on the dielectric substrate and that are connected to the IDT electrodes are face-down bonded to electrodes 11, 12, and 13 provided on the first main surface of the multilayer substrate 50 using bumps or solder, for example. The electrode 12 corresponds to the parallel-arm terminal t2 connected to the parallel-arm resonators p2 and p3.

The reception filter 40 includes, for example, a surface acoustic wave resonator including a piezoelectric substrate and IDT electrodes provided on the piezoelectric substrate. Connection electrodes that are provided on the dielectric substrate and that are connected to the IDT electrodes are face-down bonded to electrodes 41, 42, and 43 provided on the first main surface of the multilayer substrate 50 using bumps or solder, for example.

The resin member 60 is provided on the first main surface of the multilayer substrate 50. The transmission filters 10 and 30 and the reception filters 20 and 40 are covered with the resin member 60. The resin member 60 ensures the reliability, such as mechanical strength and moisture resistance, of the transmission filters and the reception filters. The resin member 60 is not a required component of the multiplexers according to the preferred embodiments of the present invention.

The transmission terminal 110, the reception terminal 120 (not illustrated), the transmission terminal 130 (not illustrated), the reception terminal 140, and a ground electrode 150G are provided on the second main surface of the multilayer substrate 50.

As illustrated in FIG. 2, the inductor Lm includes a coil pattern Lm3 (a first coil pattern) provided on the dielectric layer 53 (a first dielectric layer) and a coil pattern Lm4 (a second coil pattern) provided on the dielectric layer 54 (a second dielectric layer) different from the dielectric layer 53. It is sufficient for the coil patterns Lm3 and Lm4 to be provided on different dielectric layers in the dielectric layers 51 to 56. The number of the dielectric layers on which the coil patterns of the inductor Lm are provided is not limited to two, and the coil patterns of the inductor Lm may be provided on three or more layers.

The inductor L2 in the transmission filter 10 is provided in the multilayer substrate 50. The inductor L2 includes a coil pattern L23 (a third coil pattern) provided on the dielectric layer 53 (the first dielectric layer) and a coil pattern L22 provided on the dielectric layer 52 different from the dielectric layer 53. It is sufficient for the coil patterns L22 and L23 to be provided on different dielectric layers in the dielectric layers 51 to 56. However, the coil pattern L23 is provided on the same dielectric layer as that of the coil pattern Lm3. Among the coil patterns of the inductor L2, the coil pattern other than the coil pattern L23 may not be provided.

The coil pattern L23 and the coil pattern Lm3 are provided on the same dielectric layer 53, and the coil pattern L23 is magnetically coupled to the coil pattern Lm3.

The inductance value of the coil pattern Lm4 is higher than the inductance value of the coil pattern Lm3.

The inductor Lm is located close to the inductor L2 to magnetically couple the inductor Lm to the inductor L2. In order to achieve the close arrangement, in the multilayer substrate 50, the coil pattern of the inductor Lm and the coil pattern of the inductor L2 may be provided on the same dielectric layer to adjust the distance between the coil patterns.

However, when the inductors are provided in the multilayer substrate including the multiple dielectric layers, the inductance values of the inductors are varied due to variations in, for example, the accuracy of dimension in manufacturing and physical property values of the multilayer substrate. The variations in the inductance values of the inductors cause a variation in the degree of magnetic coupling between the inductor Lm and the inductor L2. The variation in the degree of magnetic coupling between the inductor Lm and the inductor L2 causes a problem in that the attenuation characteristics of the filter and the isolation characteristics between the filters are varied.

In contrast, with the configuration of the multiplexer 1 according to the first preferred embodiment, although the coil pattern L23 and the coil pattern Lm3, which are provided on the same dielectric layer 53, are magnetically coupled to each other to provide the magnetic coupling between the inductor Lm and the inductor L2, the inductance value of the coil pattern Lm4 is made higher than the inductance value of the coil pattern Lm3. Specifically, among the coil patterns Lm3 and Lm4 of the inductor Lm, the coil pattern Lm3 having the lower inductance value is magnetically coupled to the inductor L2. The variations in the inductance values during manufacturing are increased as the absolute values of the inductance values are increased. In other words, the variations in the degree of magnetic coupling are reduced as the inductance value of the coil pattern Lm3 to be magnetically coupled to the inductor L2 is decreased.

In terms of this, as in the multiplexer 1 according to the first preferred embodiment, making the inductance value of the coil pattern Lm3 lower than the inductance value of the coil pattern Lm4 enables the variations in the degree of magnetic coupling between the inductor Lm and the inductor L2 to be reduced or prevented. Accordingly, it is possible to achieve stable attenuation characteristics of the transmission filter 10 and stable cross-isolation characteristics between the transmission filter 10 and the reception filter 40 or stable isolation characteristics between the transmission filter 10 and the reception filter 20.

Although the magnitudes of the inductance values of the coil patterns of the inductor Lm, among the inductor Lm and the inductor L2 to be magnetically coupled to each other, are defined in the first preferred embodiment, the magnitudes of the inductance values of the coil patterns of the inductor L2 may be defined.

Specifically, referring to FIG. 2, the inductor Lm includes the coil pattern Lm3 (the third coil pattern) provided on the dielectric layer 53 and the coil pattern Lm4 provided on the dielectric layer 54. The inductor L2 includes the coil pattern L23 (the first coil pattern) provided on the dielectric layer 53 (the first dielectric layer) and the coil pattern L22 (the second coil pattern) provided on the dielectric layer 52 (the second dielectric layer) different from the dielectric layer 53.

The coil pattern L23 and the coil pattern Lm3 are provided on the same dielectric layer 53, and the coil pattern L23 is magnetically coupled to the coil pattern Lm3. At this time, instead of making the inductance value of the coil pattern Lm4 higher than the inductance value of the coil pattern Lm3, the inductance value of the coil pattern L22 may be made higher than the inductance value of the coil pattern L23.

In this case, making the inductance value of the coil pattern L23 lower than the inductance value of the coil pattern L22 enables the variation in the degree of magnetic coupling between the inductor Lm and the inductor L2 to be reduced or prevented. Accordingly, it is possible to achieve stable attenuation characteristics of the transmission filter 10 and stable cross-isolation characteristics between the transmission filter 10 and the reception filter 40 or stable isolation characteristics between the transmission filter 10 and the reception filter 20.

In the case of the above configuration, it is sufficient for the coil patterns L22 and L23 to be provided on different dielectric layers in the dielectric layers 51 to 56. The number of the dielectric layers on which the coil patterns of the inductor L2 are provided is not limited to two, and the coil patterns of the inductor L2 may be provided on three or more layers. It is sufficient for the coil patterns Lm3 and Lm4 to be provided on different dielectric layers in the dielectric layers 51 to 56. However, the coil pattern Lm3 is provided on the same dielectric layer as the coil pattern L23. Among the coil patterns of the inductor Lm, the coil pattern other than the coil pattern Lm3 may not be provided.

Although the magnitudes of the inductance values of the coil patterns of the inductor Lm, among the inductor Lm and the inductor L2 to be magnetically coupled to each other, are defined in the first preferred embodiment, the magnitudes of the inductance values of the coil patterns of the inductor L2 may also be further defined.

Specifically, referring to FIG. 2, the inductor Lm includes the coil pattern Lm3 provided on the dielectric layer 53 and the coil pattern Lm4 provided on the dielectric layer 54. The inductor L2 includes the coil pattern L23 provided on the dielectric layer 53 and the coil pattern L22 provided on the dielectric layer 52 different from the dielectric layer 53.

The coil pattern L23 and the coil pattern Lm3 are provided on the same dielectric layer 53, and the coil pattern L23 is magnetically coupled to the coil pattern Lm3. At this time, the inductance value of the coil pattern Lm4 is higher than the inductance value of the coil pattern Lm3 and the inductance value of the coil pattern L22 is higher than the inductance value of the coil pattern L23.

In this case, making the inductance value of the coil pattern L23 lower than the inductance value of the coil pattern L22 and making the inductance value of the coil pattern Lm3 lower than the inductance value of the coil pattern Lm4 enable the variation in the degree of magnetic coupling between the inductor Lm and the inductor L2 to be further reduced or prevented. Accordingly, it is possible to achieve more stable attenuation characteristics of the transmission filter 10 and more stable cross-isolation characteristics between the transmission filter 10 and the reception filter 40 or more stable isolation characteristics between the transmission filter 10 and the reception filter 20.

Figure 3A:
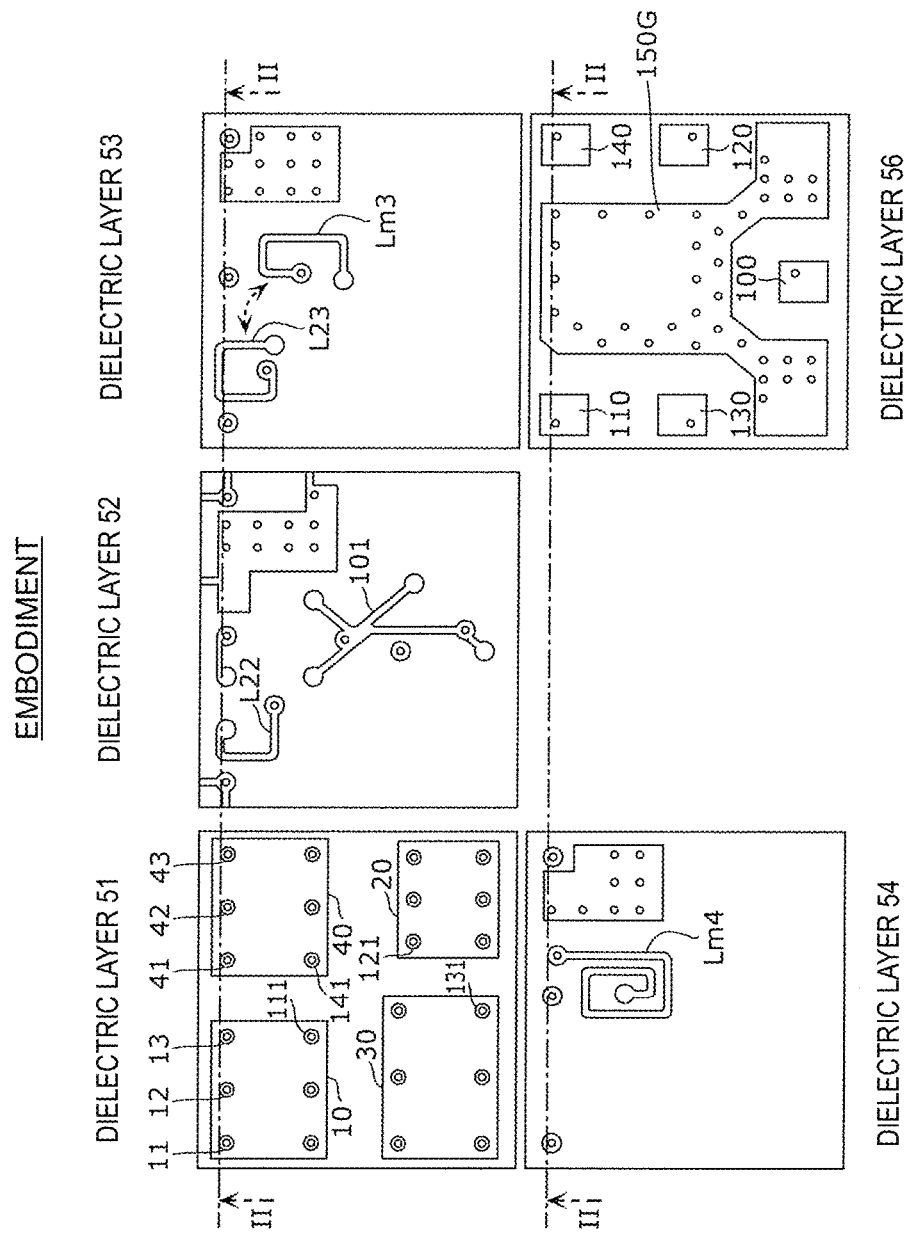
FIG. 3A illustrates conductor patterns on the respective layers of a multilayer substrate of the multiplexer according to the first preferred embodiment of the present invention.
Figure 3B:
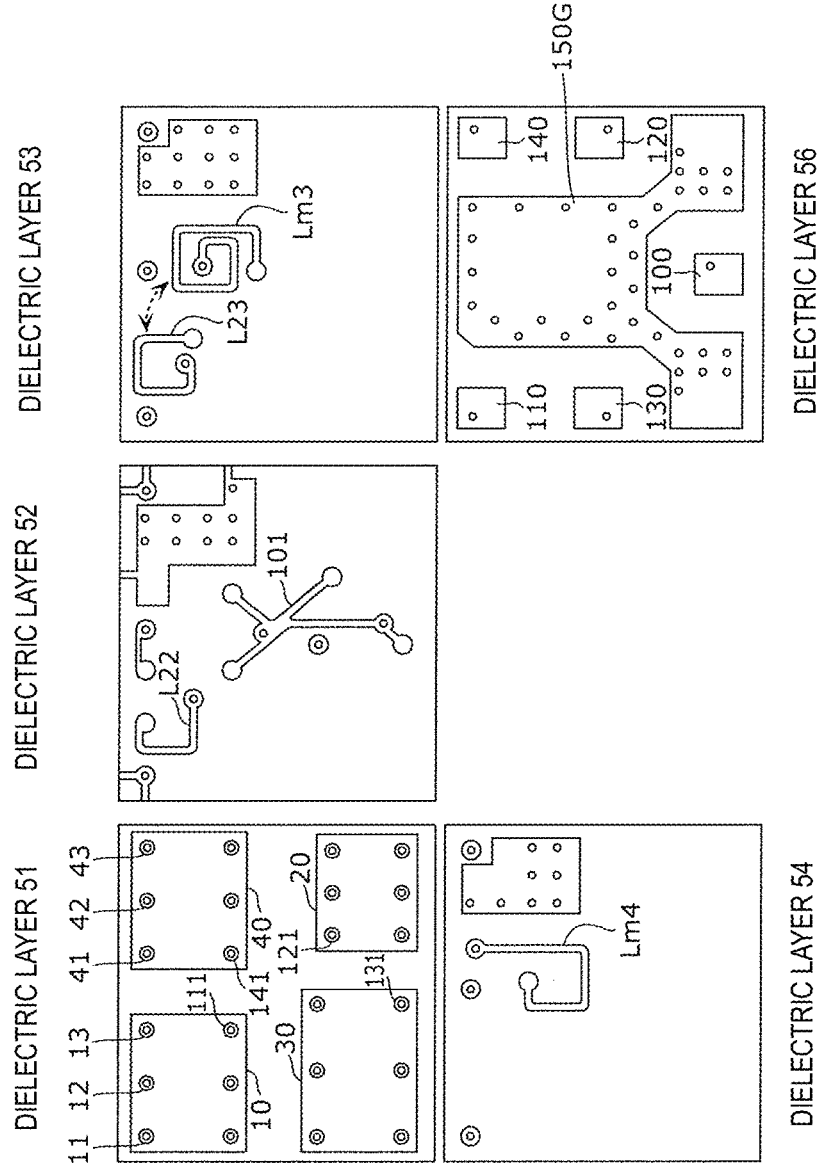
FIG. 3B illustrates the conductor patterns on the respective layers of the multilayer substrate of a multiplexer according to a comparative example.

3. Comparison Between Multiplexers According to First Preferred Embodiment and Comparative Example FIG. 3A illustrates the conductor patterns on the respective layers of the multilayer substrate 50 of the multiplexer according to the first preferred embodiment of the present invention. FIG. 3B illustrates the conductor patterns on the respective layers of the multilayer substrate 50 of a multiplexer according to a comparative example. The configuration diagram illustrating the cross section in FIG. 2 is a cross-sectional view taken along the II-II line in FIG. 3A. The layout of the conductor patterns in a plan view of the dielectric layers 51 to 54 and 56, among the dielectric layers 51 to 56 of the multilayer substrate illustrated in FIG. 2, from the first main surface side is illustrated in FIG. 3A. Although the multiplexer 1 according to the first preferred embodiment and the multiplexer according to the comparative example have the same circuit configuration illustrated in FIG. 1, the multiplexer 1 according to the first preferred embodiment differs from the multiplexer according to the comparative example in the arrangement of the coil patterns of the inductor Lm.

Via conductor patterns with which the conductor patterns on the respective layers are connected and a ground conductor pattern may be omitted in the layout of the conductor patterns of the dielectric layers 52 to 54 and 56 in FIGS. 3A and 3B.

In both of the multiplexers according to the preferred embodiment and the comparative example, the transmission filters 10 and 30 and the reception filters 20 and 40 are connected to the electrodes provided on the dielectric layer 51, as illustrated in FIGS. 3A and 3B. The output terminal 111 of the transmission filter 10, the input terminal 121 of the reception filter 20, the output terminal 131 of the transmission filter 30, and the input terminal 141 of the reception filter 40 are connected to a common electrode 101 provided on the dielectric layer 52.

The common electrode 101 provided on the dielectric layer 52 is connected to the coil pattern Lm3 of the inductor Lm, which is provided on the dielectric layer 53. The coil pattern Lm3 provided on the dielectric layer 53 is connected to the coil pattern Lm4 of the inductor Lm, which is provided on the dielectric layer 54. The coil pattern Lm4 provided on the dielectric layer is connected to the ground electrode 150G provided on the dielectric layer 56 via a via conductor.

The electrode 12 provided on the dielectric layer 51 is connected to the coil pattern L22 of the inductor L2, which is provided on the dielectric layer 52. The coil pattern L22 provided on the dielectric layer 52 is connected to the coil pattern L23 of the inductor L2, which is provided on the dielectric layer 53. The coil pattern L23 provided on the dielectric layer 53 is connected to the ground electrode 150G provided on the dielectric layer 56 via a via conductor.

As illustrated in FIG. 3B, in the multiplexer according to the comparative example, the number of turns of the coil pattern Lm4 is smaller than the number of turns of the coil pattern Lm3. With this configuration, the inductance value of the coil pattern Lm4 is lower than the inductance value of the coil pattern Lm3. Accordingly, since the inductance value of the coil pattern Lm3 to be magnetically coupled to the inductor L2 is relatively high, the variation in the degree of magnetic coupling between the inductor Lm and the inductor L2 is increased.

In contrast, as illustrated in FIG. 3A, in the multiplexer 1 according to the first preferred embodiment, the number of turns of the coil pattern Lm4 is greater than the number of turns of the coil pattern Lm3. With this configuration, the inductance value of the coil pattern Lm4 is higher than the inductance value of the coil pattern Lm3. Since the inductance value of the coil pattern Lm3 to be magnetically coupled to the inductor L2 is relatively low, the variation in the degree of magnetic coupling between the inductor Lm and the inductor L2 is reduced or prevented, compared to that in the multiplexer according to the comparative example. Accordingly, it is possible to achieve stable attenuation characteristics of the transmission filter 10 and stable cross-isolation characteristics between the transmission filter 10 and the reception filter 40 or stable isolation characteristics between the transmission filter 10 and the reception filter 20.

The line width of the coil pattern Lm4 may be smaller than the line width of the coil pattern Lm3. In this case, the inductance value of the coil pattern Lm4 is capable of being made higher than the inductance value of the coil pattern Lm3.

The maximum turning radius of the coil pattern Lm4 may be greater than the maximum turning radius of the coil pattern Lm3. In this case, the inductance value of the coil pattern Lm4 is capable of being made higher than the inductance value of the coil pattern Lm3.

Figure 4B:
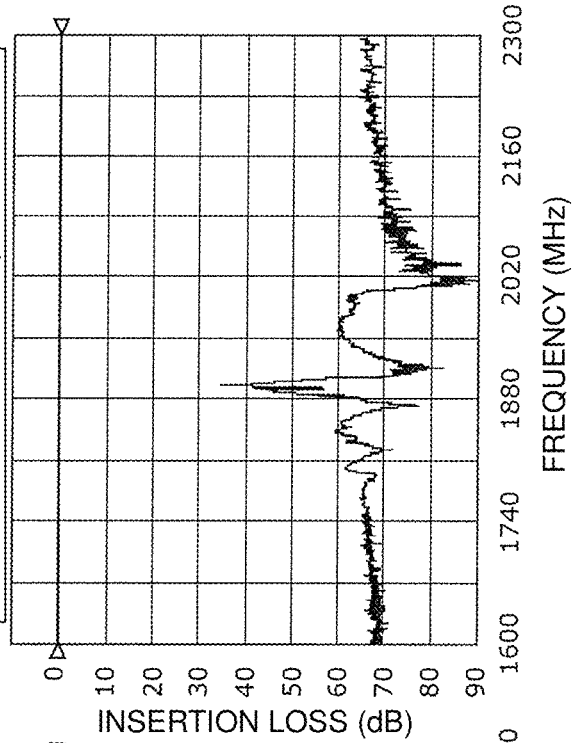
FIG. 4B is a graph illustrating a typical example of cross-isolation characteristics of the multiplexers according to the first preferred embodiment of the present invention and the comparative example.
Figure 4A:
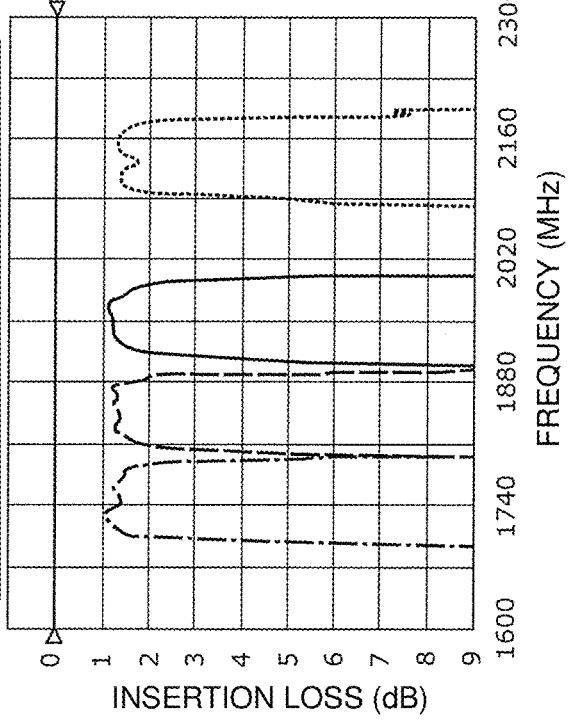
FIG. 4A is a graph illustrating a typical example of bandpass characteristics of the multiplexers according to the first preferred embodiment and the comparative example.

FIG. 4A is a graph illustrating a typical example of the bandpass characteristics of the multiplexers according to the first preferred embodiment and the comparative example. FIG. 4B is a graph illustrating a typical example of the cross-isolation characteristics of the multiplexers according to the first preferred embodiment and the comparative example. A typical example of the bandpass characteristics of the respective filters according to the first preferred embodiment and the comparative example is illustrated in FIG. 4A. A typical example of the cross-isolation characteristics between the transmission filter 10 and the reception filter 40 according to the first preferred embodiment and the comparative example is illustrated in FIG. 4B.

In the multiplexers according to the first preferred embodiment and the comparative example, Band1 (for example, transmission band: about 1,920 MHz to about 1,980 MHz and reception band: about 2,110 MHz to about 2,170 MHz) of Long Term Evolution (LTE) is applied as BandA. Band3 (for example, transmission band: about 1,710 MHz to about 1,785 MHz and reception band: about 1,805 MHz to about 1,880 MHz) of LTE is applied as BandB.

As illustrated in FIG. 4A, low loss within the pass band is ensured in the bandpass characteristics of the transmission filter 10 (between the transmission terminal 110 and the common terminal 100), the bandpass characteristics of the reception filter 20 (between the common terminal 100 and the reception terminal 120), the bandpass characteristics of the transmission filter 30 (between the transmission terminal 130 and the common terminal 100), and the bandpass characteristics of the reception filter 40 (between the common terminal 100 and the reception terminal 140).

As illustrated in FIG. 4B, in the cross-isolation characteristics between the transmission filter 10 and the reception filter 40 (between the transmission terminal 110 and the reception terminal 140), isolation higher than or equal to about 55 dB is ensured in the Band3 reception band (about 1,805 MHz to about 1,880 MHz) and the Band1 transmission band (about 1,920 MHz to about 1,980 MHz) due to the magnetic coupling between the inductor Lm and the inductor L2.

Figure 5A:
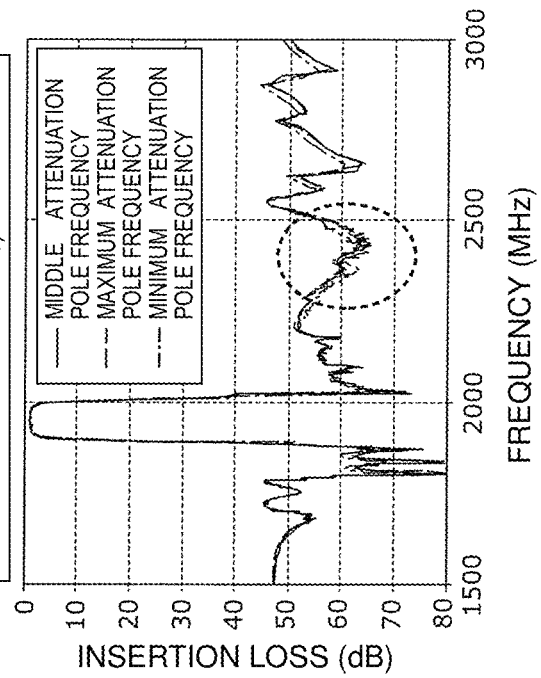
FIG. 5A is a graph illustrating variations in the cross-isolation characteristics of the multiplexer according to the first preferred embodiment.
Figure 5B:
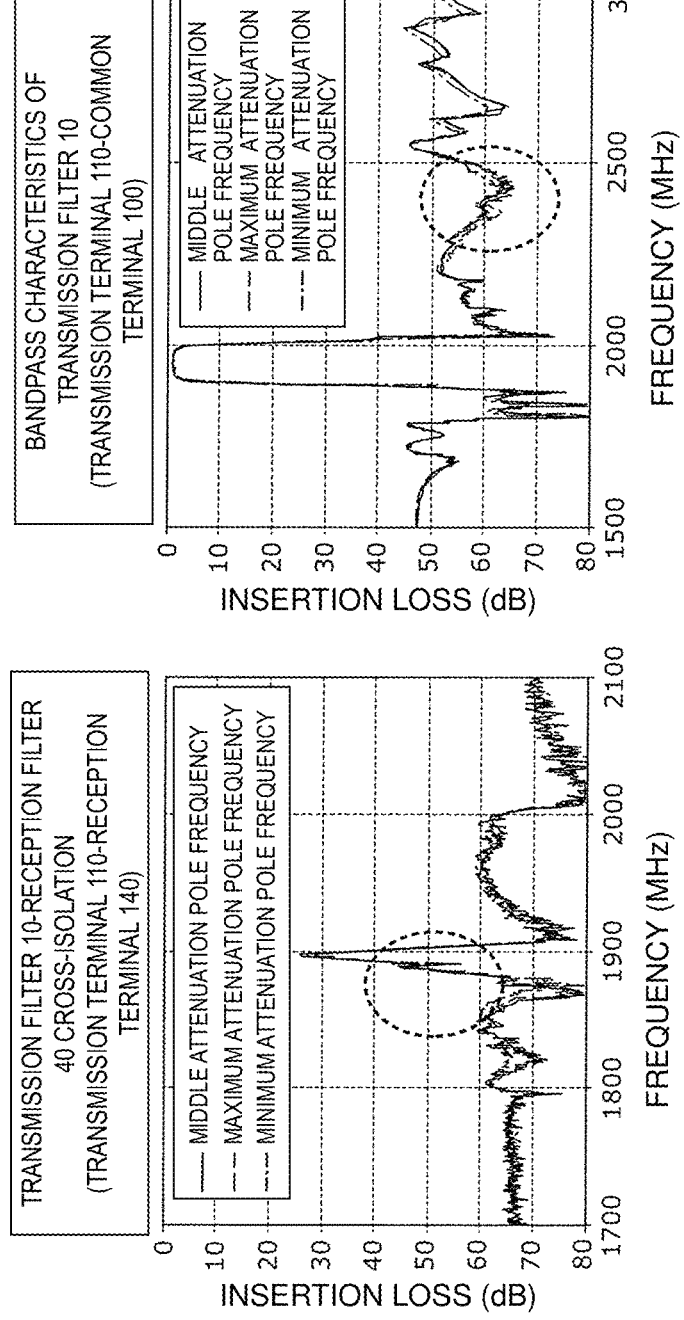
FIG. 5B is a graph illustrating variations in attenuation characteristics of the multiplexer according to the first preferred embodiment of the present invention.
Figure 5D:
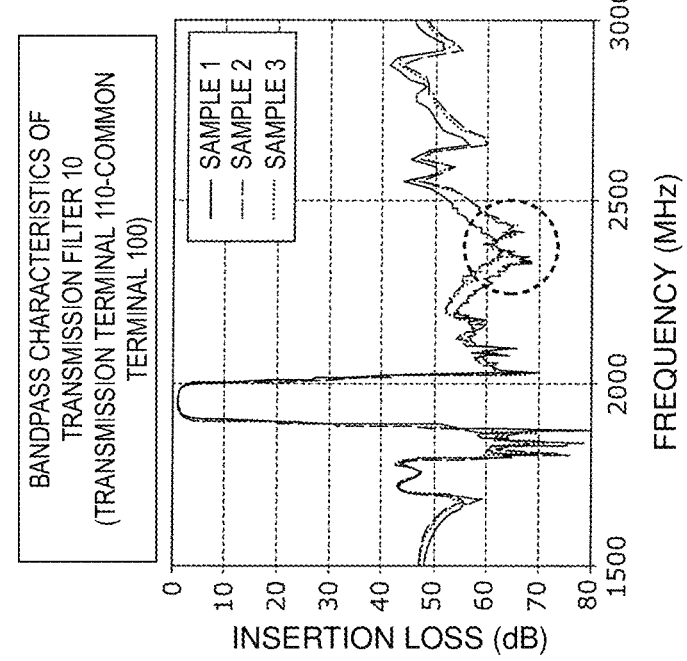
FIG. 5D is a graph illustrating variations in the attenuation characteristics of the multiplexer according to the comparative example.
Figure 5C:
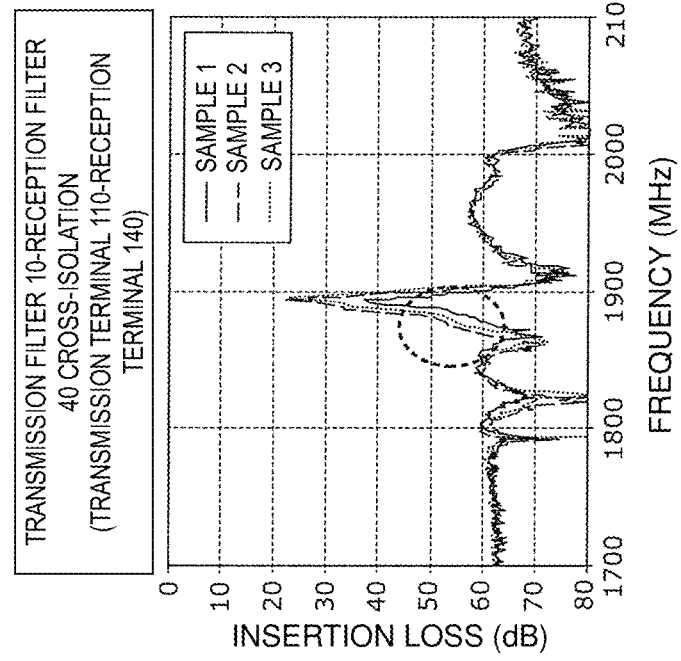
FIG. 5C is a graph illustrating variations in the cross-isolation characteristics of the multiplexer according to the comparative example.

FIG. 5A is a graph illustrating variations in the cross-isolation characteristics of the multiplexer 1 according to the first preferred embodiment. FIG. 5B is a graph illustrating variations in the attenuation characteristics of the multiplexer 1 according to the first preferred embodiment. FIG. 5C is a graph illustrating variations in the cross-isolation characteristics of the multiplexer according to the comparative example. FIG. 5D is a graph illustrating variations in the attenuation characteristics of the multiplexer according to the comparative example.

FIG. 5A illustrates the cross-isolation characteristics between the transmission filter 10 and the reception filter 40 in three samples of the multiplexer 1 according to the first preferred embodiment. FIG. 5B illustrates the bandpass characteristics of the transmission filter 10 in the three samples of the multiplexer 1 according to the first preferred embodiment. The three samples of the multiplexer 1 according to the first preferred embodiment result from, in the same production lot, extraction of the sample having the maximum attenuation pole frequency (the attenuation pole in a broken-line frame in FIG. 5B) in the bandpass characteristics of the transmission filter 10, the sample having the middle attenuation pole frequency therein, and the sample having the minimum attenuation pole frequency therein. The attenuation poles are formed through the magnetic coupling between the inductor Lm and the inductor L2.

FIG. 5C illustrates the cross-isolation characteristics between the transmission filter 10 and the reception filter 40 in the three samples of the multiplexer according to the comparative example. FIG. 5D illustrates the bandpass characteristics of the transmission filter 10 in the three samples of the multiplexer according to the comparative example. The three samples (a sample 1, a sample 2, and a sample 3) of the multiplexer according to the comparative example are extracted at random in the same production lot. The attenuation poles in a broken-line frame in FIG. 5D are provided by the magnetic coupling between the inductor Lm and the inductor L2.

As illustrated in FIG. 5D, the frequency of the attenuation pole provided by the magnetic coupling between the inductor Lm and the inductor L2 is varied between the three samples. This causes a variation in the insertion loss at a high-frequency end portion of the Band3 reception band (for example, about 1,805 MHz to about 1,880 MHz) in the cross-isolation characteristics between the transmission filter 10 and the reception filter 40, as illustrated in FIG. 5C.

Specifically, in the samples 2 and 3 in which the frequencies of the attenuation poles illustrated in FIG. 5D are shifted toward the high frequency side, the insertion losses at the high-frequency end portion of the Band3 reception band, illustrated in FIG. 5C, are decreased. Accordingly, the cross-isolation in the Band3 reception band (for example, about 1,805 MHz to about 1,880 MHz) is lower than or equal to about 55 dB. In other words, in the multiplexer according to the comparative example, the cross-isolation characteristics are degraded due to a variation in the magnetic coupling between the inductor Lm and the inductor L2.

In contrast, in the multiplexer 1 according to the first preferred embodiment, the variation in the frequency of the attenuation pole, illustrated in FIG. 5B, is relatively small even when the three samples having the maximum variation in the frequency of the attenuation pole are extracted in the same production lot. This causes small variations in the attenuation characteristics of the transmission filter 10 and the cross-isolation characteristics between the transmission filter 10 and the reception filter 40, as illustrated in FIG. 5A. The cross-isolation in the Band3 reception band is maintained at about 55 dB or more.

From comparison between the characteristics in FIGS. 5A to 5D, making the inductance value of the coil pattern Lm3 lower than the inductance value of the coil pattern Lm4, as in the multiplexer 1 according to the first preferred embodiment, enables the variation in the degree of magnetic coupling between the inductor Lm and the inductor L2 to be reduced or prevented. Accordingly, it is possible to achieve stable attenuation characteristics of the transmission filter 10 and stable cross-isolation characteristics between the transmission filter 10 and the reception filter 40.

Although the configuration is described in the first preferred embodiment in which the variation in the cross-isolation characteristics between the transmission filter 10 and the reception filter 40 is improved, the multiplexer 1 according to the first preferred embodiment is also applicable to a case in which the variation in the isolation characteristics between the transmission filter 10 and the reception filter 20 is to be improved. In this case, the transmission filter 10 corresponds to the first filter, the reception filter 20 corresponds to the second filter, the first frequency band corresponds to the BandA transmission band, and the second frequency band corresponds to the BandA reception band.

In the multiplexer 1 according to the first preferred embodiment, Band25 (for example, transmission band: about 1,850 MHz to about 1,915 MHz and reception band: about 1,930 MHz to about 1,995 MHz) of LTE may be applied as BandA. Band66 (for example, transmission band: about 1,710 MHz to about 1,780 MHz and reception band: about 2,110 MHz to about 2,200 MHz) of LTE may be applied as BandB. In this case, for example, the excellent cross-isolation characteristics are capable of being achieved in the Band 66 reception band (about 2,110 MHz to about 2,200 MHz) and the Band25 transmission band (about 1,850 MHz to about 1,915 MHz).

Second Preferred Embodiment

In a second preferred embodiment of the present invention, a multiplexer 1A and a communication apparatus 6 including the multiplexer 1A will be described. In the multiplexer 1A, a switch circuit to select a combination of the frequency bands at which the CA is performed is added to the multiplexer 1 according to the first preferred embodiment.

Figure 6:
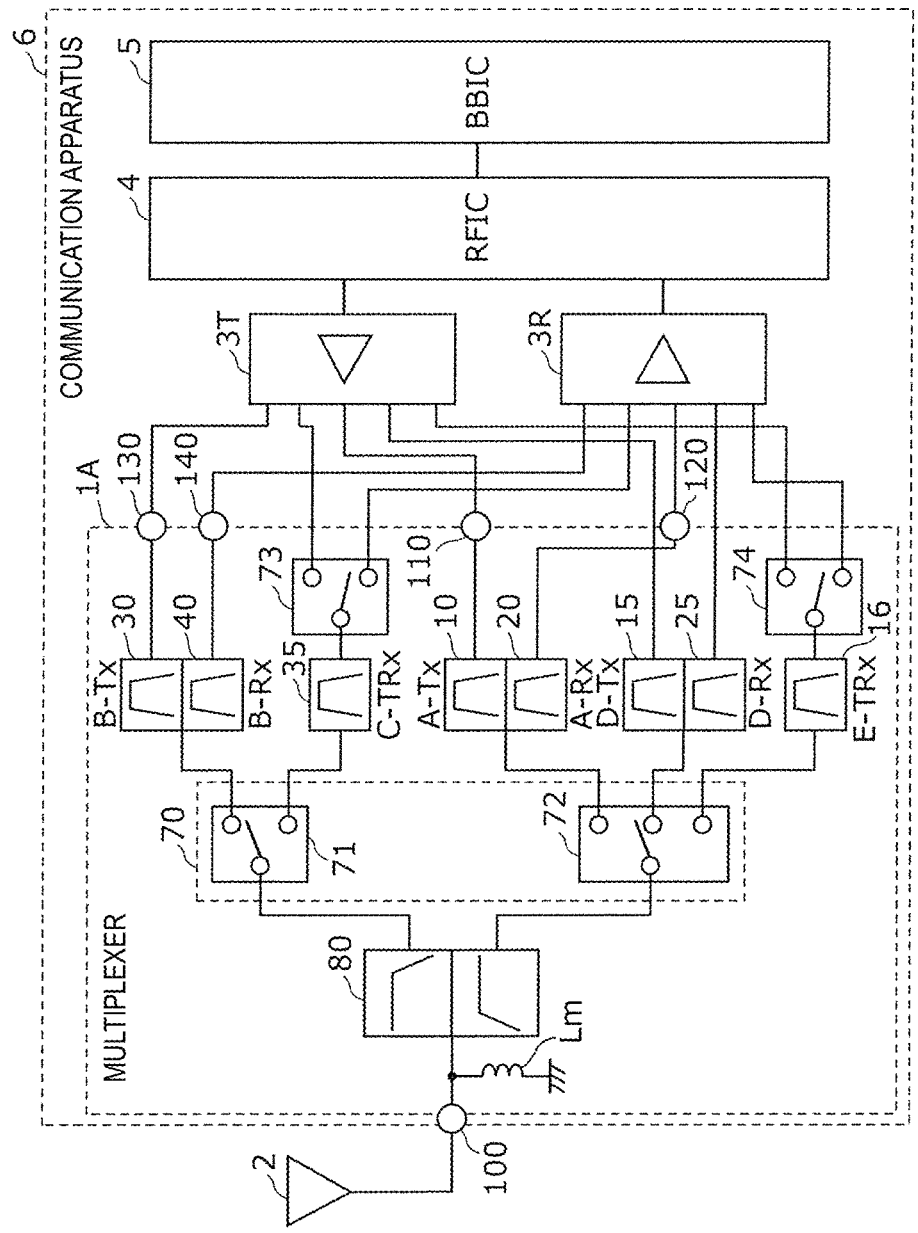
FIG. 6 is a circuit diagram of a communication apparatus according to a second preferred embodiment of the present invention.

FIG. 6 is a circuit diagram of the communication apparatus 6 according to the second preferred embodiment. Referring to FIG. 6, the communication apparatus 6 includes the multiplexer 1A, a transmission amplifier circuit 3T, a reception amplifier circuit 3R, a radio-frequency (RF) signal processing circuit (radio-frequency integrated circuit (RFIC)) 4, and a baseband signal processing circuit (baseband integrated circuit (BBIC)) 5.

The multiplexer 1A further includes a transmission filter 15, a reception filter 25, a transmission-reception filters 16 and 35, a switch circuit 70, switches 73 and 74, and a diplexer 80, in addition to the components in the multiplexer 1 according to the first preferred embodiment. The inductor Lm may be provided in series between the common terminal 100 and the diplexer 80.

The transmission filter 10 is the first filter that is provided between the transmission amplifier circuit 3T and the switch circuit 70 and that uses the BandA transmission band (the first frequency band) as the pass band.

The reception filter 20 is provided between the switch circuit 70 and the reception amplifier circuit 3R and uses the BandA reception band as the pass band.

The transmission filter 30 is provided between the transmission amplifier circuit 3T and the switch circuit 70 and uses the BandB transmission band as the pass band.

The reception filter 40 is provided between the switch circuit 70 and the reception amplifier circuit 3R and uses the BandB reception band (the second frequency band) as the pass band.

The transmission filter 15 is provided between the transmission amplifier circuit 3T and the switch circuit 70 and uses a BandD transmission band as the pass band.

The reception filter 25 is provided between the switch circuit 70 and the reception amplifier circuit 3R and uses a BandD reception band as the pass band.

The transmission-reception filter 16 is provided between the switch circuit 70 and the switch 74 and uses a BandE transmission-reception band as the pass band.

The transmission-reception filter 35 is provided between the switch circuit 70 and the switch 73 and uses a BandC transmission-reception band as the pass band.

The switch circuit 70 includes switches 71 and 72. The switch 71 exclusively switches between connection between the transmission filter 30 and reception filter 40 and the diplexer 80 and connection between the transmission-reception filter 35 and the diplexer 80. The switch 71 is preferably, for example, a single pole double throw (SPDT) switch. The switch 72 exclusively switches between connection between the transmission filter 10 and the reception filter 20 and the diplexer 80, connection between the transmission filter 15 and the reception filter 25 and the diplexer 80, and connection between the transmission-reception filter 16 and the diplexer 80. The switch 72 is preferably, for example, a single pole 3 throw (SP3T) switch.

The switch 73 exclusively switches between connection between the transmission-reception filter 35 and the transmission amplifier circuit 3T and connection between the transmission-reception filter 35 and the reception amplifier circuit 3R. The switch 73 is preferably, for example, a SPDT switch. The switch exclusively switches between connection between the transmission-reception filter 16 and the transmission amplifier circuit 3T and connection between the transmission-reception filter 16 and the reception amplifier circuit 3R. The switch 74 is preferably, for example, a SPDT switch.

With the above configuration of the switch circuit 70, the multiplexer 1A is capable of concurrently transmitting, concurrently receiving, and concurrently transmitting and receiving a radio-frequency signal of either of BandB and BandC and a radio-frequency signal of any of BandA, BandD, and BandE.

The switch circuit 70 is not limited to the configuration including the two switches 71 and 72, and it is sufficient for the switch circuit 70 to be a circuit capable of concurrently connecting two or more paths. For example, the switch circuit 70 may have a configuration in which multiple single pole single throw (SPST) switches are arranged in parallel.

The diplexer 80 is provided between the common terminal 100 and the switch circuit 70 and includes a low pass filter and a high pass filter. The low pass filter is connected to the common terminal 100 and the switch 71 and passes a radio-frequency signal in a low frequency side band group including BandB and BandC. The high pass filter is connected to the common terminal 100 and the switch 72 and passes a radio-frequency signal in a high frequency side band group including BandA, BandD, and BandE. With this configuration, the diplexer 80 performs demultiplexing between the radio-frequency signal in the low frequency side band group and the radio-frequency signal in the high frequency side band group and multiplexing of the radio-frequency signal in the low frequency side band group and the radio-frequency signal in the high frequency side band group.

The diplexer 80 is not a necessary component in the multiplexer 1A. In addition, the diplexer 80 may be a multiplexer that performs demultiplexing between the radio-frequency signals in three or more frequency band groups and multiplexing of the radio-frequency signals in the three or more frequency band groups, instead of the demultiplexing between the radio-frequency signals in the two frequency band groups and multiplexing of the radio-frequency signals in the two frequency band groups, as in the second preferred embodiment.

The number of frequency bands in which the multiplexer 1A according to the second preferred embodiment transmits is not limited to five from BandA to BandE and the multiplexer 1A according to the second preferred embodiment may transmit the radio-frequency signals in two or more frequency bands.

Although the multiplexer 1A according to the second preferred embodiment magnetically couple the coil pattern L23 to the coil pattern Lm3, which are provided on the same dielectric layer 53, in the magnetic coupling between the inductor Lm and the inductor L2 in the transmission filter 10, as in the multiplexer 1 according to the first preferred embodiment, the inductance value of the coil pattern Lm4 is higher than the inductance value of the coil pattern Lm3. In other words, among the coil patterns Lm3 and Lm4 of the inductor Lm, the coil pattern Lm3 having the lower inductance value is magnetically coupled to the inductor L2.

With the above configuration, the variation in the degree of magnetic coupling between the inductor Lm and the inductor L2 is able to be reduced or prevented. Accordingly, it is possible to achieve stable attenuation characteristics of the transmission filter 10 and stable cross-isolation characteristics between the transmission filter 10 and the reception filter 40 or the stable isolation characteristics between the transmission filter 10 and the reception filter 20.

The transmission amplifier circuit 3T amplifies the radio-frequency transmission signal supplied from the RFIC 4 and supplies the amplified radio-frequency transmission signal to the multiplexer 1A. The reception amplifier circuit 3R amplifies the radio-frequency reception signal that is received with an antenna element 2 and that passes through the multiplexer 1A and supplies the amplified radio-frequency reception signal to the RFIC 4.

The RFIC 4 is the RF signal processing circuit that processes the radio-frequency signal and supplies the processed radio-frequency signal to the transmission amplifier circuit 3T and that processes the radio-frequency signal supplied from the reception amplifier circuit 3R. Specifically, the RFIC 4 performs the signal processing, such as down-conversion, for example, of the radio-frequency reception signal, which is supplied from the antenna element 2 through the multiplexer 1A and the reception amplifier circuit 3R, and supplies the radio-frequency reception signal subjected to the signal processing to the BBIC 5. In addition, the RFIC 4 performs the signal processing, such as up-conversion, for example, of the transmission signal, which is supplied from the BBIC 5, and supplies the radio-frequency transmission signal subjected to the signal processing to the transmission amplifier circuit 3T and the multiplexer 1A.

In the second preferred embodiment, the RFIC 4 also defines and functions as a controller that controls the connection of the switches 71 to 74 in the multiplexer 1A based on the used band (frequency band). Specifically, the RFIC 4 switches the connection of the switches 71 to 74 in response to a control signal (not illustrated). The controller may be provided outside the RFIC 4 and, for example, may be provided in the multiplexer 1A or the BBIC 5.

With the above configuration, it is possible to provide the communication apparatus 6 having the improved cross-isolation between the filters that pass the radio-frequency signals in different frequency bands while maintaining the attenuation characteristics of the respective filters of the multiplexer 1A.

Although the multiplexers and the communication apparatuses according to the first and second preferred embodiments of the present invention are described above, the present invention is not limited to the above preferred embodiments. Other preferred embodiments obtained by combining arbitrary components in the above preferred embodiments, modifications resulting from making various changes conceived by the persons skilled in the art to the above preferred embodiments without departing from the scope and sprit of the present invention, and various devices incorporating the multiplexer and the communication apparatus according to the preferred embodiments of the present invention are also included in the present invention.

In addition, for example, matching elements, such as inductors and capacitors, and switch circuits may be connected between the respective components in the multiplexers and the communication apparatus according to the first and second preferred embodiments. The inductors may include wiring inductors defined by lines connecting the respective components.

Preferred embodiments of the present invention are widely usable in communication devices, such as mobile phones, for example, as the multiplexer and the communication apparatus applicable to a multiband system capable of performing the CA.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multiplexer comprising:
a common terminal;
a first terminal;

a second terminal;
a first filter between the common terminal and the first terminal and that uses a first frequency band as a pass band;
a second filter between the common terminal and the second terminal and that uses a second frequency band different from the first frequency band as the pass band;
a first inductor connected to the common terminal; and
a multilayer substrate on which the first filter and the second filter are mounted and which includes a plurality of dielectric layers including conductor patterns provided thereon; wherein
the first filter includes:
a first parallel-arm resonator connected between a first path between the common terminal and the first terminal and a first parallel-arm terminal; and
a second inductor connected between the first parallel-arm terminal and ground;
one of the first inductor and the second inductor includes:
a first coil pattern on a first dielectric layer, among the plurality of dielectric layers; and
a second coil pattern on a second dielectric layer of the plurality of dielectric layers different from the first dielectric layer;
another of the first inductor and the second inductor includes a third coil pattern on the first dielectric layer and that is magnetically coupled to the first coil pattern; and
an inductance value of the second coil pattern is higher than an inductance value of the first coil pattern.

2. The multiplexer according to claim 1, wherein
the first inductor includes the first coil pattern and the second coil pattern; and
the second inductor includes the third coil pattern.

3. The multiplexer according to claim 1, wherein a number of turns of the second coil pattern is greater than a number of turns of the first coil pattern.

4. The multiplexer according to claim 1, wherein a line width of the second coil pattern is smaller than a line width of the first coil pattern.

5. The multiplexer according to claim 1, wherein a maximum turning radius of the second coil pattern is greater than a maximum turning radius of the first coil pattern.

6. The multiplexer according to claim 1, wherein
the first frequency band is included in Band1 of Long Term Evolution;
the second frequency band is included in Band3 of Long Term Evolution;
the first filter is a transmission filter that uses a Band1 transmission band as the pass band; and
the second filter is a reception filter that uses a Band3 reception band as the pass band.

7. The multiplexer according to claim 1, wherein
the first frequency band is included in Band25 of Long Term Evolution;
the second frequency band is included in Band66 of Long Term Evolution;
the first filter is a transmission filter that uses a Band25 transmission band as the pass band; and
wherein the second filter is a reception filter that uses a Band66 reception band as the pass band.

8. The multiplexer according to claim 1, further comprising a switch circuit between the common terminal and the first filter and the second filter and that is capable of concurrently performing connection between the common terminal and the first filter and connection between the common terminal and the second filter.

9. The multiplexer according to claim 1, wherein the first filter is one of a surface acoustic wave filter, an acoustic wave filter using bulk acoustic waves, an LC resonance filter, and a dielectric filter.

10. The multiplexer according to claim 1, further comprising a resin located on the multilayer substrate and covering the first and second filters.

11. A communication apparatus comprising:
the multiplexer according to claim 1;
an amplifier circuit connected to the first terminal and the second terminal; and
a radio-frequency signal processing circuit that processes a radio-frequency signal and supplies the radio-frequency signal to the amplifier circuit and that processes a radio-frequency signal supplied from the amplifier circuit.

12. The communication apparatus according to claim 11, wherein
the first inductor includes the first coil pattern and the second coil pattern; and
the second inductor includes the third coil pattern.

13. The communication apparatus according to claim 11, wherein a number of turns of the second coil pattern is greater than a number of turns of the first coil pattern.

14. The communication apparatus according to claim 11, wherein a line width of the second coil pattern is smaller than a line width of the first coil pattern.

15. The communication apparatus according to claim 11, wherein a maximum turning radius of the second coil pattern is greater than a maximum turning radius of the first coil pattern.

16. The communication apparatus according to claim 11, wherein
the first frequency band is included in Band1 of Long Term Evolution;
the second frequency band is included in Band3 of Long Term Evolution;
the first filter is a transmission filter that uses a Band1 transmission band as the pass band; and
the second filter is a reception filter that uses a Band3 reception band as the pass band.

17. The communication apparatus according to claim 11, wherein
the first frequency band is included in Band25 of Long Term Evolution;
the second frequency band is included in Band66 of Long Term Evolution;
the first filter is a transmission filter that uses a Band25 transmission band as the pass band; and
wherein the second filter is a reception filter that uses a Band66 reception band as the pass band.

18. The communication apparatus according to claim 11, further comprising a switch circuit between the common terminal and the first filter and the second filter and that is capable of concurrently performing connection between the common terminal and the first filter and connection between the common terminal and the second filter.

19. The communication apparatus according to claim 11, wherein the first filter is one of a surface acoustic wave filter, an acoustic wave filter using bulk acoustic waves, an LC resonance filter, and a dielectric filter.

20. The communication apparatus according to claim 11, further comprising a resin located on the multilayer substrate and covering the first and second filters.

* * * * *